(12) United States Patent
Lin

(10) Patent No.: US 6,524,950 B1
(45) Date of Patent: Feb. 25, 2003

(54) METHOD OF FABRICATING COPPER DAMASCENE

(75) Inventor: Bih-Tiao Lin, Ping-Tung Hsien (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 0 days.

(21) Appl. No.: 09/535,494

(22) Filed: Mar. 24, 2000

(30) Foreign Application Priority Data

Feb. 23, 2000 (TW) ........................................ 89103124 A

(51) Int. Cl.[7] .......................................... H01L 21/4763
(52) U.S. Cl. ...................... 438/644; 438/645; 438/680; 438/692; 438/639
(58) Field of Search ................................ 438/637, 638, 438/687, 597, 618, 620, 626, 627, 628, 629, 631, 633, 634, 639, 643, 644, 645, 672, 675

(56) References Cited

U.S. PATENT DOCUMENTS 5,354,712 A * 10/1994 Ho et al. ................... 437/195
5,654,245 A * 8/1997 Allen .......................... 438/629
5,895,261 A * 4/1999 Schinella et al. ........... 438/586
6,010,962 A * 1/2000 Liu et al. .................... 438/687
6,093,656 A * 7/2000 Lin ............................. 438/734
6,162,727 A * 12/2000 Schonauer et al. ......... 438/687
6,174,811 B1 * 1/2001 Ding et al. ................. 438/687
6,287,968 B1 * 9/2001 Yu et al. ..................... 438/675

* cited by examiner

Primary Examiner—Olik Chaudhuri
Assistant Examiner—Julio J. Maldonado
(74) Attorney, Agent, or Firm—J.C. Patents

(57) ABSTRACT

A method of fabricating copper damascene. In this invention, only crystalline copper metal layer is formed inside the damascene trench and only amorphous copper metal layer is formed outside the damascene trench. During stacking the copper metal layer, copper metal stacks up to form crystalline copper metal with good lattice packing according to the position of the copper seed layer. Conversely, amorphous copper metal is formed in positions where no copper seed layer exists. Since the amorphous copper metal is softer than the crystalline copper metal, lower pressure and the ordinary slurry are used in chemical mechanical polishing to remove amorphous copper metal layer outside the damascene trench, in order to form a flat-surfaced copper damascene structure.

10 Claims, 3 Drawing Sheets

METHOD OF FABRICATING COPPER DAMASCENE

CROSS-REFERENCE TO RELATED APPLICATION

This application claims the priority benefit of Taiwan application Ser. No. 89103124, filed Feb. 23, 2000.

BACKGROUND OF THE INVENTION

1. Field of Invention

The present invention relates to a method of fabricating copper damascene. More particularly, the present invention relates to a method of fabricating multi-level metal interconnects.

2. Description of Related Art

As higher integration is required for integrated circuits, less chip surface area is available for interconnects fabrication. In order to be compatible with the requirement for increasing interconnects and minimizing metal-oxide-semiconductor (MOS) transistors, multi-level interconnect structures are widely used in the manufacture process of integrated circuits. To the latter parts of manufacture processes for semiconductor devices, the current density and the resistance of the metal line increase as the width of the metal line decreases. Therefore, the conventional metal line that is made of aluminum metal suffers from electromigration (EM), and reliability of the device is reduced. In place of aluminum, copper metal with lower resistance and less electromigration has become the major choice for semiconductor devices to solve the prior art problems.

Copper metal is widely used in metal interconnect fabrication because copper metal has many advantages, such as low resistivity, high melting points and high electromigration resistance. If copper metal is used in metal interconnects, instead of aluminum metal, the operation speed of the chip can be improved as much as doubled. Copper damascene is used to form copper metal interconnects, so that resistance-capacitance (RC) delay time and static charge capacity of metal interconnects can be reduced. Therefore, the trend is to use copper metal in metal interconnects in order to increase integration and conducting speed of the device.

However, copper metal can easily diffuse into material consisting of silicon and silicon oxide. Therefore, a barrier layer is deposited on the dielectric layer that is made of silicon oxide before the opening in the dielectric layer is filled with copper metal so that copper metal can no longer diffuse into the dielectric layer to cause a short in the device.

Furthermore, copper metal cannot be etched with conventional etching gases. Metal damascene is therefore used in the fabrication of copper metal interconnects. In metal damascene processes, an opening for a metal interconnect is etched first in a dielectric layer and the opening is filled with a metal material to form a metal interconnect. Because metal damascene satisfies the requirement of high reliability and high yield interconnects, metal damascene becomes the best choice for fabricating metal interconnects in sub-quarter micron processes.

In the prior art, after the opening in the dielectric layer is filled with copper metal, chemical mechanical polishing (CMP) is used to remove copper metal above the dielectric layer and outside the opening. Since copper metal is softer than aluminum metal, chemical mechanical polishing can cause severe dishing pits on the surface of metal lines; for example, a dishing pit deeper than 0.1 micron occurs in the copper metal line manufacture process of 0.8 to 1.0 micron.

FIGS. 1A and 1B are schematic, cross-sectional views illustrating the fabrication processes of a copper damascene structure according to the prior art.

Referring to FIG. 1A, a dielectric layer 100 is defined to form a damascene trench 102. A conformal barrier layer 104 is formed over dielectric layer 100 and damascene trench 102. A conformal copper seed layer 106 is formed on conformal barrier layer 104. A copper metal layer 108 is formed on conformal copper seed layer 106 and fills up damascene trench 102.

Referring to FIG. 1B, chemical mechanical polishing with a pressure of about 300 to about 400 gw/cm$^2$ is used to sequentially remove copper metal layer 108, conformal copper seed layer 106 and conformal barrier layer 104 above the surface of dielectric layer 100. Copper damascene 108$a$, conformal copper seed layer 106$a$ and conformal barrier layer 104$a$ are formed thereon.

In the prior art, the copper seed layer is situated inside and outside the damascene trench; therefore, only a crystalline copper metal layer is formed. The crystalline copper metal layer has good lattice packing and is harder, so that higher pressure and the specific slurry for copper metal must be used in chemical mechanical polishing to remove the crystalline copper metal layer. Therefore, dishing pits are caused by the stress of chemical mechanical polishing in copper damascene according to the prior art.

SUMMARY OF THE INVENTION

The invention provides a method of fabricating copper damascene. This method prevents dishing pits formation in the copper damascene.

The invention provides a method of fabricating copper damascene with chemical mechanical polishing. In addition to preventing the dishing pits from occurring in copper damascene, the cost of chemical mechanical polishing is also reduced.

The invention further provides a method of fabricating multi-level interconnects in the semiconductor devices. This invention provides a method of fabricating a flat-surfaced copper metal line.

As embodied and broadly described herein, the invention provides a method of fabricating copper damascene. A material layer containing a damascene trench is formed on a substrate. A conformal barrier layer that is made of, for example, tantalum nitride/tantalum, tantalum, titanium nitride or tungsten nitride, is formed to cover the damascene trench and the material layer. A conformal copper seed layer is formed on the conformal barrier layer. A photoresist layer is spin-coated to fill up the damascene trench and cover the conformal copper seed layer. A part of the photoresist layer and a part of the conformal copper seed layer that are outside the damascene trench are removed by chemical mechanical polishing until the conformal barrier layer outside the damascene trench is exposed. The remaining part of photoresist layer inside the damascene trench serves as protection for the conformal copper seed layer on the sidewalls of the damascene trench, to prevent the conformal copper seed layer being damaged by slurry employed in a chemical mechanical polishing step. After removing the photoresist damascene, a copper metal layer is formed on the conformal barrier layer and fills up the damascene trench. Chemical mechanical polishing with lower pressure is performed to remove the copper metal layer and the conformal barrier layer. A flat-surfaced copper damascene structure is formed inside the damascene trench.

This invention provides a method of fabricating copper damascene and for preventing dishing pits formation in the copper damascene. The pressure applied in the chemical mechanical polishing step to remove the copper metal layer and the conformal barrier layer is about 120 to about 240 gw/cm$^2$, lower than that pressure used in the chemical mechanical polishing step in the prior art. Furthermore, the slurry used in the chemical mechanical polishing step is not specific for copper metal, so that the cost of the chemical mechanical polishing step is reduced. This invention can be used to form a flat-surfaced metal line in multi-level interconnects for semiconductor devices.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

Figure 1A:
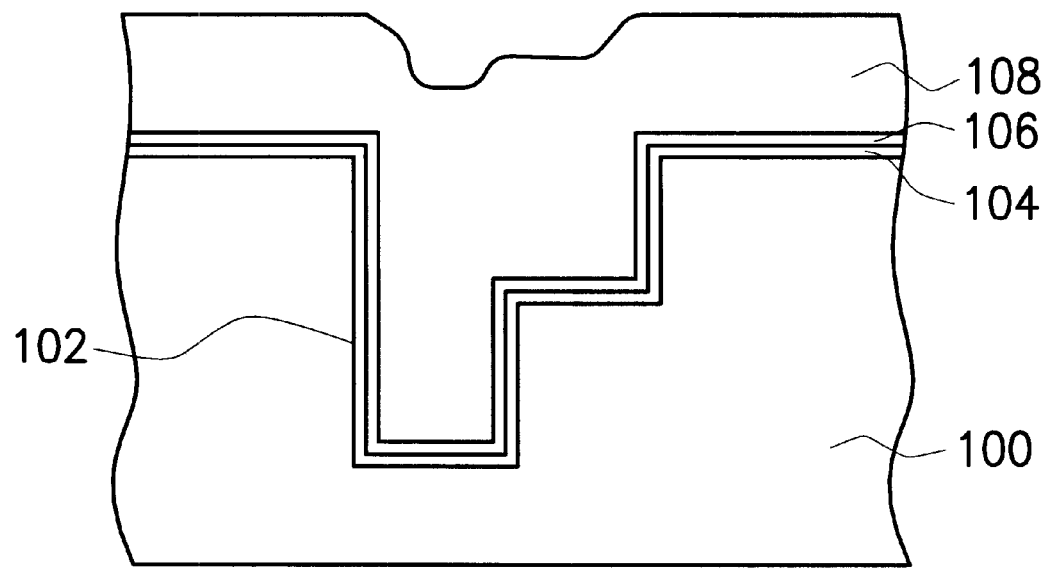
FIGS. 1A and 1B are schematic, cross-sectional views illustrating the fabrication processes of a copper damascene structure according to the prior art.
Figure 1B:
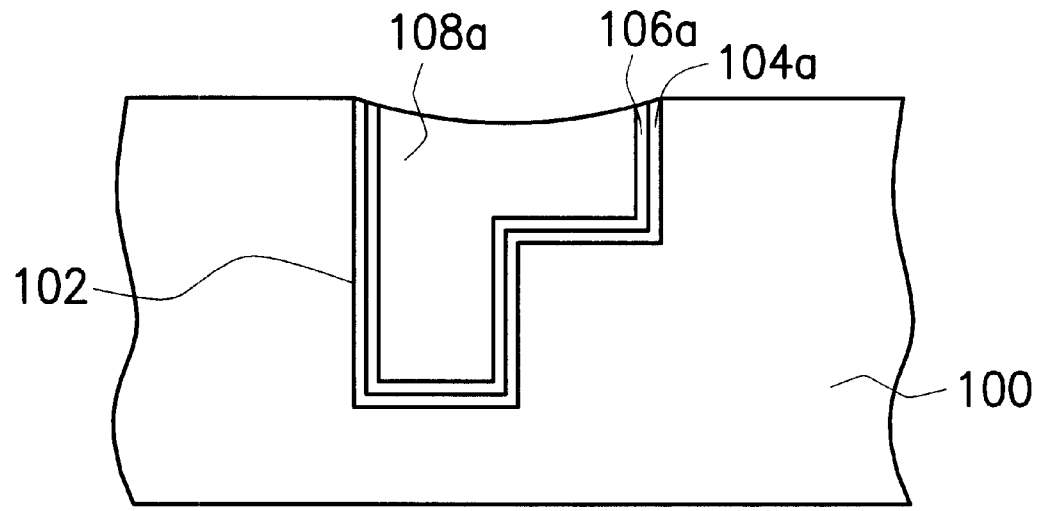
Figure 2A:
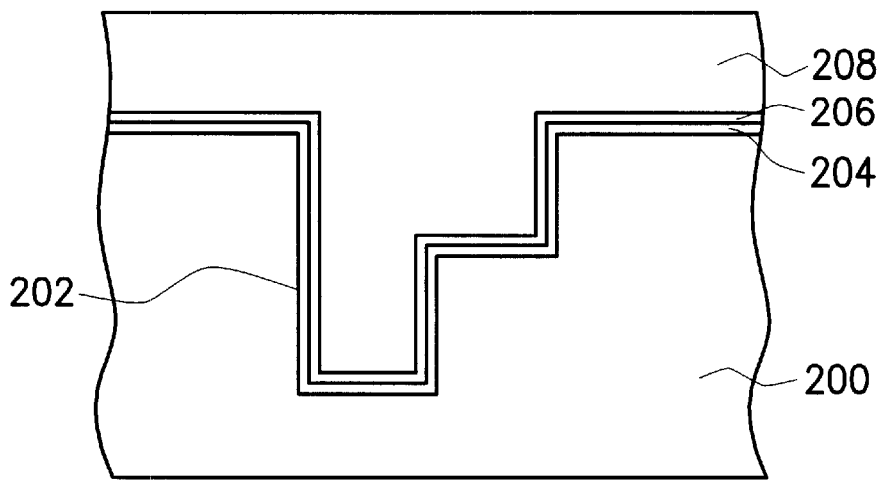
FIGS. 2A to 2E are schematic, cross-sectional views illustrating the fabrication processes of a flat-surfaced copper damascene structure according to one preferred embodiment of this invention.

Referring to FIG. 2A, a material layer 200 is formed on a substrate (not shown). A damascene trench 202 is formed by, for example, etching in material layer 200. A conformal barrier layer 204 is formed on material layer 200 and fills up damascene trench 202. A material for barrier layer 204 can be, for example, tantalum nitride/tantalum, tantalum, titanium nitride and tungsten nitride.

A conformal copper seed layer 206 is formed on the surface of conformal barrier layer 204. A photoresist layer is spin-coated on conformal copper seed layer 206 and fills up damascene trench 202. Conformal copper seed layer 206 can be formed by, for example, physical vapor deposition.

Figure 2B:
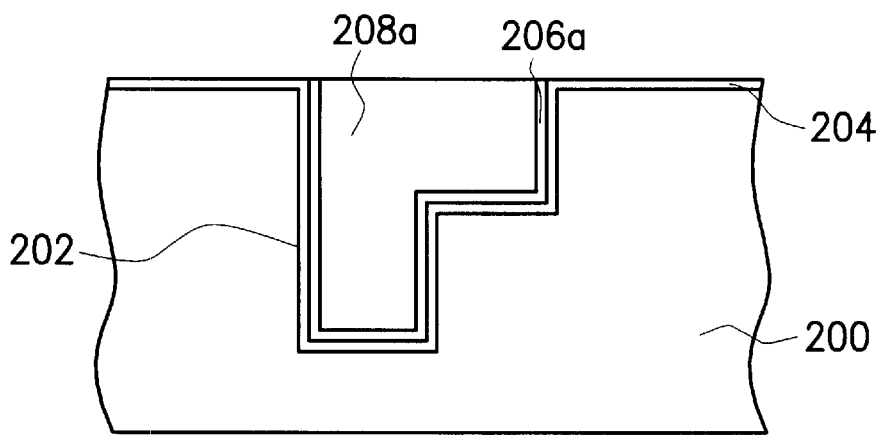

Referring to FIG. 2B, conformal barrier layer 204 is used as stop layer to remove photoresist layer 208 and conformal copper seed layer 206 by, for example, chemical mechanical polishing, until the surface of conformal barrier layer 204 is exposed. A copper seed layer 206a and a photoresist layer 208a are formed thereon.

Figure 2C:
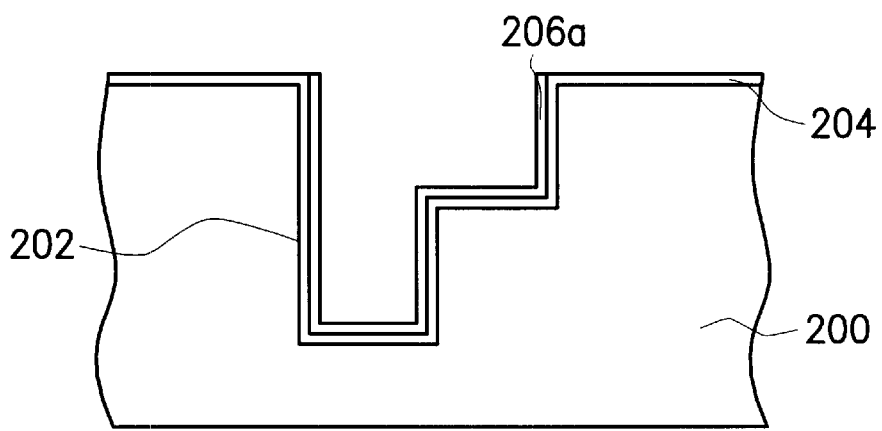

Referring to FIG. 2C, photoresist layer 208a inside damascene trench 202 is removed by, for example, oxygen plasma etching, and damascene trench 202 is further cleaned with organic or inorganic solution to remove any remaining photoresist.

Figure 2D:
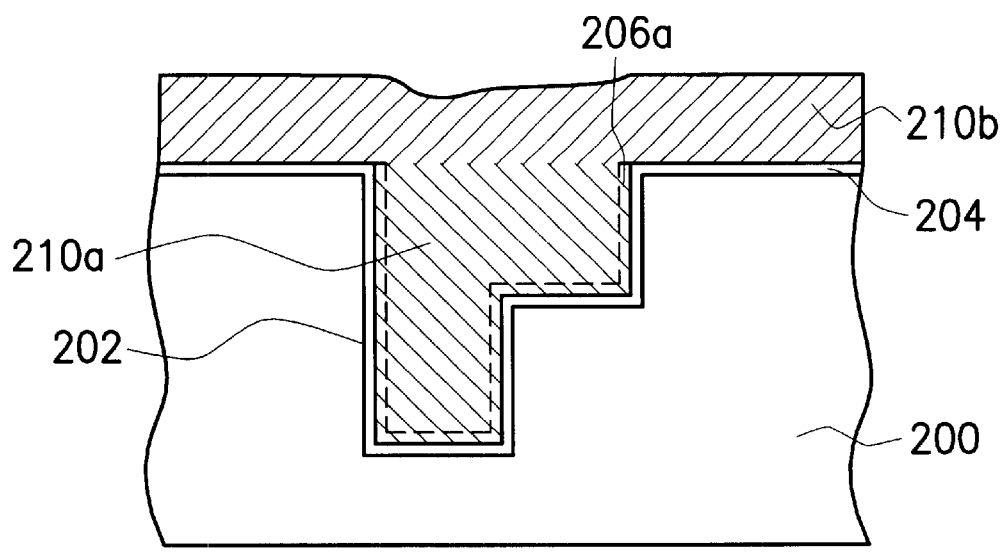

Referring to FIG. 2D, two copper metal layers 210a, 210b are formed sequentially to fill up damascene trench 202 as well as cover conformal barrier layer 204. Two copper metal layers are a crystalline copper metal layer 210a and a amorphous copper metal layer 210b, formed by, for example, physical vapor deposition, chemical vapor deposition and electroplating.

Figure 2E:
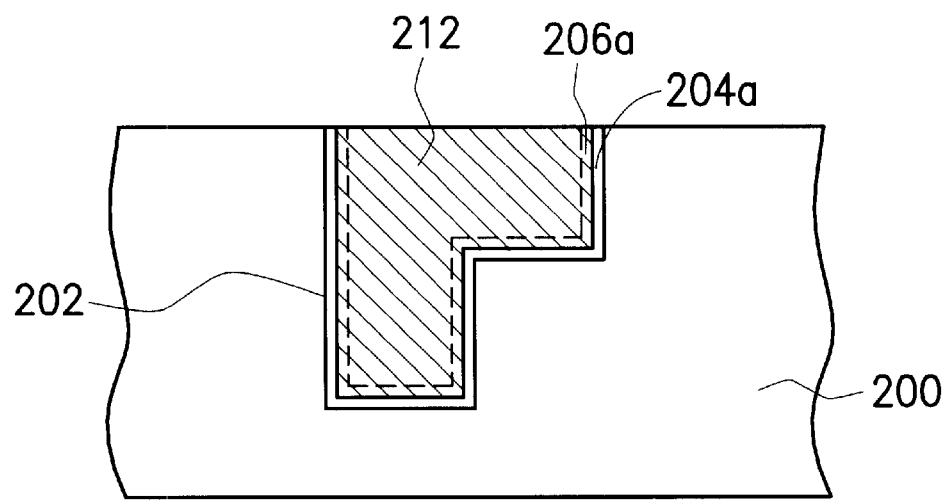

Referring to FIG. 2E, material layer 200 is used as stop layer to remove amorphous copper metal layer 210b, a small part of crystalline copper metal layer 210a and conformal barrier layer 204 by chemical mechanical polishing. A flat-surfaced copper damascene structure 212 and a conformal barrier layer 204a are formed thereon inside damascene trench 202. A pressure range for chemical mechanical polishing is about 120 to about 240 gw/cm$^2$, with a slurry, such as, Shibaura CHS600 slurry consisting mainly of hydrogen peroxide and aluminum oxide particles.

Instead of the slurry specific for copper metal, the ordinary slurry commonly used for the barrier layer is chosen for chemical mechanical polishing in this invention; therefore, it prevents forming the dishing pit in copper damascene and reduces the cost for the manufacture process.

During the process of forming two copper metal layers, because the conformal copper seed layer is situated on the surface of the damascene trench, copper metal grows up according to the lattice packing type of the conformal copper seed layer and forms the crystalline copper metal layer with good lattice packing (shown in FIG. 2D). Conversely, the conformal copper seed layer situated outside the damascene trench has been removed during previous chemical mechanical polishing (shown in FIG. 2B), so that copper metal cannot easily stack up and forms the amorphous copper metal layer.

Since the amorphous copper metal layer is softer than the crystalline copper metal layer with good lattice packing, lower pressure is used in chemical mechanical polishing to remove the amorphous copper metal layer. Compared with the pressure used in the prior art to remove crystalline copper metal layer, only about half of the pressure is used for chemical mechanical polishing in this invention. Moreover, the ordinary slurry for the barrier layer is used, instead of the specific slurry for copper metal, so that the cost of chemical mechanical polishing is reduced. Copper metal stacks up faster together with good lattice packing when copper seed exists. On the contrary, copper metal stacks up slower together with bad lattice packing when no copper seed exists.

According to the previous improvements of copper damascene described herein, this invention employs possible methods to form crystalline copper seed layer only inside the damascene trench. Therefore, only crystalline copper metal layer is formed inside the damascene trench and only amorphous copper metal layer is formed outside the damascene trench. Compared with the prior art, the ordinary slurry for the barrier layer is used in chemical mechanical polishing to remove the copper metal layer outside the damascene trench; furthermore, only half of the pressure is used and the stress of chemical mechanical polishing is reduced. Therefore, the flat-surfaced copper damascene structure is formed.

In this invention, the copper damascene structure is formed with a lower cost of chemical mechanical polishing compared to the prior art. The copper damascene structure is flat-surfaced, which means dishing pits are prevented during formation of the copper damascene structure.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A method of fabricating flat-surfaced copper damascene comprising a plurality of damascene trenches in a material layer, which material layer is formed on a substrate, the method comprising:

forming a conformal barrier layer and a copper seed layer sequentially in the damascene trenches and over the material layer;

removing a portion of the copper seed layer outside said damascene trenches;

performing a copper metal deposition process over the substrate, wherein a crystalline copper metal layer is formed over the damascene trenches to fill up the damascene trenches, and an amorphous copper metal layer is formed over the material layer outside said damascene trenches; and performing a chemical mechanical polishing process to remove a portion of the crystalline copper metal layer, the conformal barrier layer and the amorphous copper metal layer above a surface of the material layer until the material layer is exposed.

2. The method as claimed in claim 1, wherein a material for the conformal barrier layer is selected from a group consisting of tantalum nitride/tantalum, tantalum, titanium nitride and tungsten nitride.

3. The method as claimed in claim 1, wherein the step for forming the conformal copper seed layer comprises physical vapor deposition.

4. The method as claimed in claim 1, wherein the copper metal deposition process comprises chemical vapor deposition.

5. The method as claimed in claim 1, wherein the copper metal deposition process comprises electroplating.

6. The method as claimed in claim 1, wherein the chemical mechanical polishing process is performed at a pressure of about 120 to about 240 gw/cm$^2$.

7. A method of fabricating copper damascene comprising:

providing a substrate having a damascene trench;

forming a conformal barrier layer over the substrate;

forming a conformal copper seed layer on the conformal barrier layer;

forming a photoresist layer to fill up the damascene trench;

removing a part of the photoresist layer and a part of the conformal copper seed layer that are outside the damascene trench, so as to expose a portion of the conformal barrier layer that is located outside the damascene trench;

removing the remaining photoresist layer;

performing a copper metal deposition process over the substrate, so that a crystalline copper metal layer is formed over the damascene trench to filling up the damascene trench, and an amorphous copper metal layer is formed on the exposed portion of the conformal barrier layer outside the damascene trench; and performing a chemical mechanical process to remove a portion of the crystalline copper layer, the amorphous copper metal layer and the conformal barrier layer outside the damascene trench so as to form the copper damascene.

8. The method of fabricating copper damascene as claimed in claim 7, wherein the photoresist layer is formed by spin-coating.

9. The method of fabricating copper damascene as claimed in claim 7, wherein the step of removing a part of the photoresist layer and a part of the conformal copper seed layer that are outside the damascene trench is performed by chemical mechanical polishing.

10. The method of fabricating copper damascene as claimed in claim 7, further comprising a material layer on the substrate, wherein the damascene trench is located in the material layer and the conformal barrier layer is formed on the material layer.

* * * * *